US011908950B2

(12) United States Patent
Maxey et al.

(10) Patent No.: US 11,908,950 B2
(45) Date of Patent: Feb. 20, 2024

(54) CHARGE-TRANSFER SPACERS FOR STACKED NANORIBBON 2D TRANSISTORS

(71) Applicant: Intel Corporation, Santa Clara, CA (US)

(72) Inventors: Kirby Maxey, Hillsboro, OR (US); Chelsey Dorow, Portland, OR (US); Kevin P. O'Brien, Portland, OR (US); Carl Naylor, Portland, OR (US); Ashish Verma Penumatcha, Beaverton, OR (US); Tanay Gosavi, Portland, OR (US); Uygar E. Avci, Portland, OR (US); Shriram Shivaraman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 736 days.

(21) Appl. No.: 16/902,069

(22) Filed: Jun. 15, 2020

(65) Prior Publication Data
US 2021/0391478 A1 Dec. 16, 2021

(51) Int. Cl.
*H01L 29/786* (2006.01)
*H01L 29/423* (2006.01)
*H01L 29/66* (2006.01)
*H01L 29/24* (2006.01)

(52) U.S. Cl.
CPC ........ *H01L 29/78696* (2013.01); *H01L 29/24* (2013.01); *H01L 29/42392* (2013.01); *H01L 29/66969* (2013.01)

(58) Field of Classification Search
CPC ............... H01L 29/78696; H01L 29/24; H01L 29/42392; H01L 29/66969; H01L 29/41725; H01L 29/775; H01L 29/408; H01L 29/778; B82Y 10/00
USPC .......................................................... 257/29
See application file for complete search history.

(56) References Cited

U.S. PATENT DOCUMENTS

2018/0212023 A1* 7/2018 Weber ................. H01L 29/0847
2021/0135015 A1* 5/2021 Frougier .............. H01L 29/778

* cited by examiner

*Primary Examiner* — Tong-Ho Kim
(74) *Attorney, Agent, or Firm* — Schwabe, Williamson & Wyatt, P.C.

(57) ABSTRACT

Embodiments include two-dimensional (2D) semiconductor sheet transistors and methods of forming such devices. In an embodiment, a semiconductor device comprises a stack of 2D semiconductor sheets, where individual ones of the 2D semiconductor sheets have a first end and a second end opposite from the first end. In an embodiment, a first spacer is over the first end of the 2D semiconductor sheets, and a second spacer is over the second end of the 2D semiconductor sheets. Embodiments further comprise a gate electrode between the first spacer and the second spacer, a source contact adjacent to the first end of the 2D semiconductor sheets, and a drain contact adjacent to the second end of the 2D semiconductor sheets.

24 Claims, 11 Drawing Sheets

US 11,908,950 B2

CHARGE-TRANSFER SPACERS FOR STACKED NANORIBBON 2D TRANSISTORS

TECHNICAL FIELD

Embodiments of the present disclosure relate to semiconductor devices, and more particularly to nanoribbon two-dimensional (2D) transistors with charge-transfer spacers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, research into two-dimensional (2D) semiconductor devices, such as transition metal dichalcogenides (TMDs), has become more prevalent as a way to provide further scaling down of dimensions. Particularly, TMD devices allow for improved short channel effects and allow for additional scaling of transistor devices. Scaling 2D semiconductor transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

EMBODIMENTS OF THE PRESENT DISCLOSURE

Figure 1A:
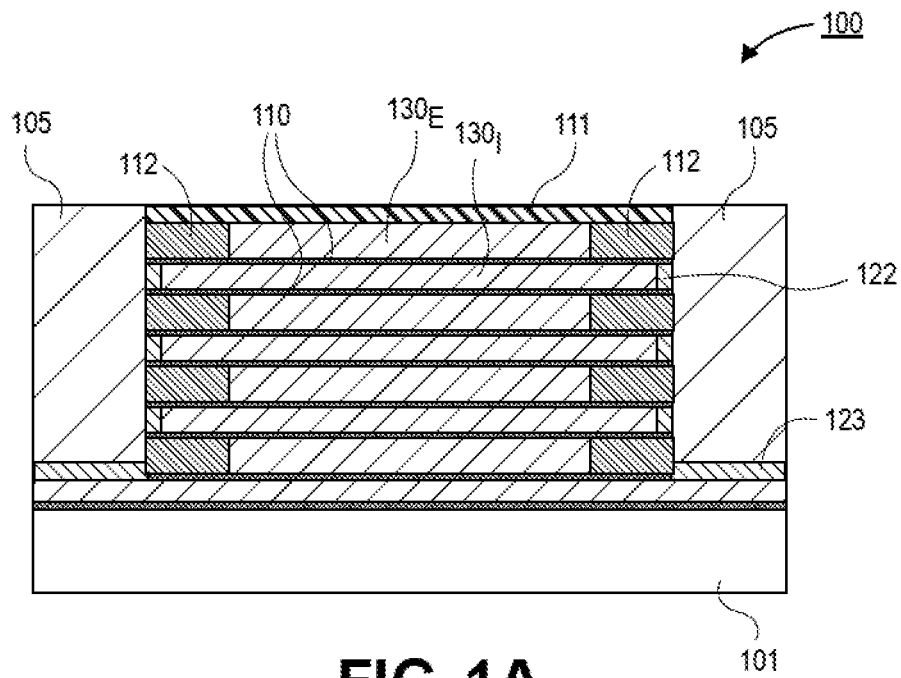
FIG. 1A is a cross-sectional illustration of a two-dimensional (2D) semiconductor device with charge transfer spacers, in accordance with an embodiment.

Described herein are nanoribbon two-dimensional (2D) transistors with charge-transfer spacers, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, scaling of two-dimensional (2D) semiconductor devices is not without issues. Particularly, 2D semiconductor devices suffer from contact resistances that are, at best, an order of magnitude higher than what is generally needed for high-performance devices. This is due to the inability to selectively dope the contact regions with current reactors, processes, and integration flows. Monolayer 2D materials have the potential to outperform silicon and group III-V transistors for gate lengths $L_g$ below approximately 10 nm due to the decreased short channel effects. However, they need appreciable intrinsic channel quality with highly-doped source/drain (S/D) regions to obtain proper ON and OFF currents. They also likely need to be integrated in a stacked nanoribbon fashion in order to provide the needed ON current per area footprint.

High ON currents and low OFF currents have been shown independently in 2D transistors, but not at the same time. High ON currents have been demonstrated by doping the entire semiconductor via substitutional dopants in chemical vapor transport or by charge transfer doping from oxides or molecules. Doping the entire semiconductor prevents the material from achieving low OFF currents due to the shifting of the Fermi level towards more free carriers not only in the contact regions, but also in the channel. This prevents the gate from turning the channel off. Low OFF currents have been shown for intrinsic chemical vapor deposition (CVD) and exfoliated 2D materials, but all with contact resistances significantly greater than 100 Ωμm. Intrinsic material can be adequately gated to show OFF currents below 1 pA/μm, but ON currents are approximately 10 μA/μm for the same drain bias. Furthermore, there are no solutions for stacked nanoribbon 2D material architectures.

Accordingly, embodiments disclosed herein include an integration scheme that allows for both stacked transistor channels and a spacer dielectric for doping the contact and access regions of the device. This charge transfer spacer architecture is fully compatible with 2D materials. In general, the scheme includes forming a 2D nanosheet transistor that comprises an intrinsic channel and contact regions that are doped to move the Fermi level closer to the conduction (or valence) band. The doping of the contact region is provided by the formation of charge transfer spacers around the contact regions. This provides localized doping of the contact region while allowing the channel region to remain intrinsic.

Referring now to FIG. 1A, a cross-sectional illustration of a 2D nanosheet transistor 100 is shown, in accordance with an embodiment. In an embodiment, the 2D nanosheet transistor 100 is formed over a substrate 101. The substrate 101 may be a semiconductor substrate. In an embodiment, the underlying semiconductor substrate 101 represents a general workpiece object used to manufacture integrated circuits. The semiconductor substrate 101 often includes a wafer or other piece of silicon or another semiconductor material. Suitable semiconductor substrates 101 include, but are not limited to, single crystal silicon, polycrystalline silicon and silicon on insulator (SOI), as well as similar substrates formed of other semiconductor materials, such as substrates including germanium, carbon, or group III-V materials.

In an embodiment, a stack of 2D semiconductor sheets 110 are disposed over the substrate 101. As shown in the cross-section, a pair of 2D semiconductor sheets 110 (i.e., a bottom sheet 110 and a top sheet 110) are sandwiched between portions of a spacer 112. In some embodiments, the bottom portion and the top portion may be connected to each other out of the plane illustrated in FIG. 1A in order to form an enclosed tube-like structure. In some embodiments, the tube-like structure may comprise an opening (e.g. along the length of the tube or a portion of the length of the tube) in order to provide an access point to contact an interior gate electrode 130I between pairs of the 2D semiconductor sheets 110. In the illustrated embodiment, four pairs of 2D semiconductor sheets 110 are shown in the stack. However, it is to be appreciated that any number of 2D semiconductor sheets 110 may be provided in the transistor 100. In an embodiment, a barrier layer 111 may be disposed over the 2D semiconductor sheets 110.

In an embodiment, the 2D semiconductor sheets 110 may comprise any suitable 2D semiconductor material. A 2D semiconductor material is a type of natural semiconductor with thicknesses on the atomic scale. For example, the 2D semiconductor material may have a thickness that is provided by a single atomic layer of the material (i.e., a monolayer of the 2D semiconductor material). In other embodiments, the 2D semiconductor sheets 110 may comprise several layers of the 2D semiconductor material. In a particular embodiment, the 2D semiconductor sheets 110 may comprise van der Waals 2D materials (2D materials for short). One class of 2D materials are transition metal dichalcogenides (TMDs). TMDs are a class of two-dimensional materials, which commonly have the chemical formula $MX_2$, where M represents transition metals and X represents a chalcogen, such as sulfur, selenium or tellurium. For example, the TMD semiconductor sheets 110 may include, but are not limited to, $MoS_2$, $WS_2$, $MoSe_2$, and $WSe_2$. It is to be appreciated that 2D materials are not limited to the TMDs. For example, 2D materials may also include indium selenide (InSe).

In an embodiment, the 2D semiconductor sheets 110 may be double gated. That is, an interior and an exterior surface of the 2D semiconductor sheets 110 may be gated. An interior gate electrode 130I is provided between pairs of 2D semiconductor sheets 110, and an exterior gate electrode 130E is provided over the surfaces of each 2D semiconductor sheets 110 opposite from the interior gate electrode 130I. In the illustrated embodiment, the gate electrodes 130 are each shown as a single layer for simplicity. However, it is to be appreciated that a high-k dielectric may be between the conductive material of the gate electrodes and the 2D semiconductor sheets.

In an embodiment, S/D contacts 105 are provided on opposite ends of the 2D semiconductor sheets 110. The S/D contacts 105 may be highly doped semiconductor materials or conductive materials. In an embodiment, the S/D contacts 105 are isolated from the interior gate electrode 130I by an insulating plug 122 at the end of the 2D semiconductor sheets 110. For example, the insulating plug 122 may be an oxide or a nitride. In an embodiment, an insulating layer 123 may be disposed over exposed portions of the bottommost interior gate electrode 130I that extends out beyond the edge of the 2D semiconductor sheets 110.

In an embodiment, a pair of spacers 112 may be provided over opposite ends of the 2D semiconductor sheets 110. For example, pairs of 2D semiconductor sheets 110 may be sandwiched between portions of the spacer 112. The spacers 112 may be formed of a material that allows for charge transfer doping within the contact region of the 2D semiconductor sheets 110 (i.e., the end regions that are contacted by the S/D contacts 105). For example, the spacers 112 may comprise a material such as, but not limited to, aluminum oxide or molybdenum oxide. Furthermore, since the spacers 112 are localized to the ends of the 2D semiconductor sheets 110, the channel region is left substantially undoped (i.e., intrinsic). This provides low OFF currents for the transistor device 100.

Figure 2:
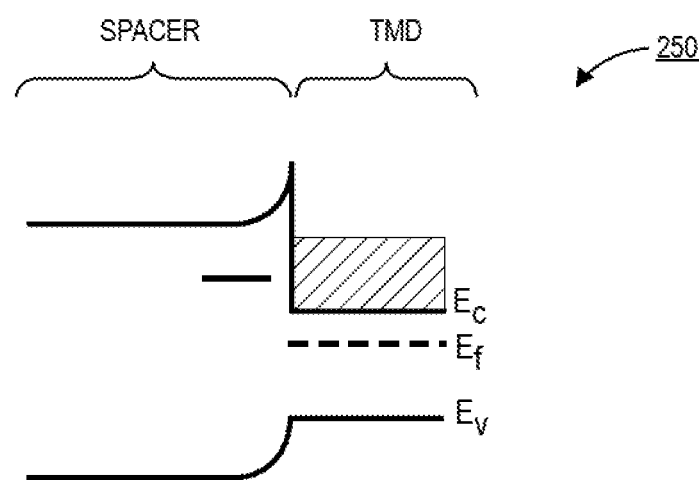
FIG. 2 is a band diagram that illustrates the charge transfer provided by the charge transfer spacers, in accordance with an embodiment.

An example of charge transfer doping is provided in the band diagram 250 in FIG. 2. As shown, the spacer includes an interstitial defect site that is able to donate charge carriers to the TMD semiconductor material. This allows for the Fermi level $E_f$ to be moved closer to the conduction band Ec. As such, a contact resistance of the TMD is reduced.

Figure 1B:
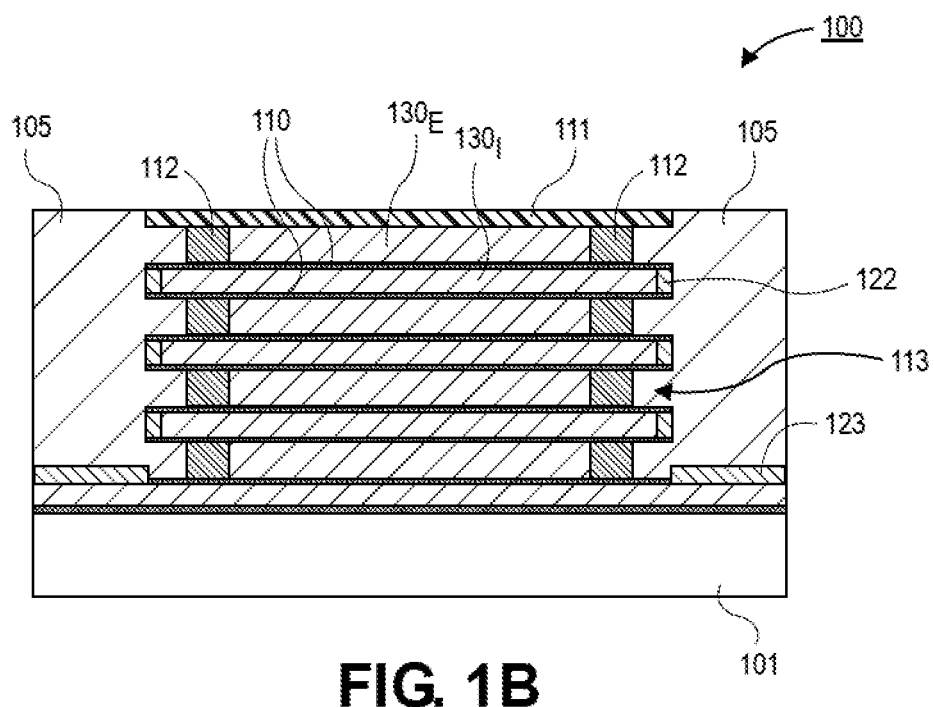
FIG. 1B is a cross-sectional illustration of a 2D semiconductor device with charge transfer spacers that are recessed, in accordance with an embodiment.

Referring now to FIG. 1B, a cross-sectional illustration of a transistor device 100 is shown, in accordance with an additional embodiment. In an embodiment, the transistor device 100 in FIG. 1B is substantially similar to the transistor device 100 in FIG. 1A, with the exception that the spacers 112 are laterally recessed. As shown, recesses 113 are provided at the outer edges of the spacers 112. The recess 113 may then be filled by the S/D contacts 105. Such an embodiment provides an increased surface area interface between the 2D semiconductor sheets 110 and the S/D contacts 105.

Figure 1C:
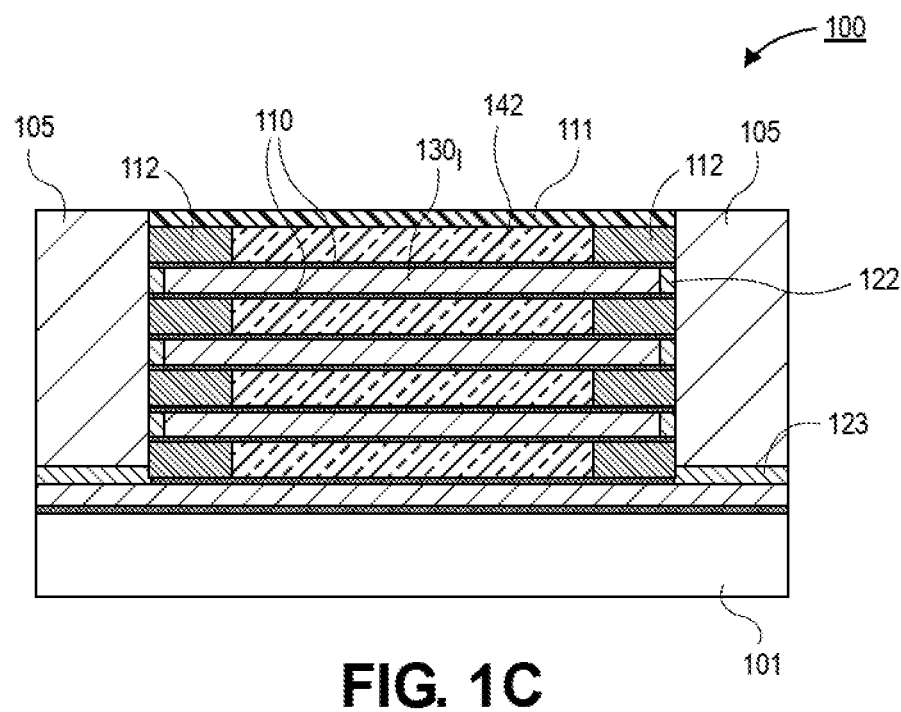
FIG. 1C is a cross-sectional illustration of a 2D semiconductor device with charge transfer spacers that is singly gated, in accordance with an embodiment.

Referring now to FIG. 1C, a cross-sectional illustration of a transistor device 100 is shown, in accordance with yet another additional embodiment. The transistor device 100 in FIG. 1C may be substantially similar to the transistor device 100 in FIG. 1A, with the exception of the omission of the exterior gate electrode 130E. Instead, an insulating layer 142 is provide around the 2D semiconductor sheets 110. Such an embodiment may be referred to as a singly gated transistor device 100 since a gate is only present along an interior surface of the 2D semiconductor sheets 110.

Referring now to FIGS. 3A-3K, a series of cross-sectional illustrations depicting a process for forming a semiconductor device 300 is shown, in accordance with an embodiment. The semiconductor device 300 may be substantially similar to the semiconductor device 100 in FIG. 1A.

Figure 3A:
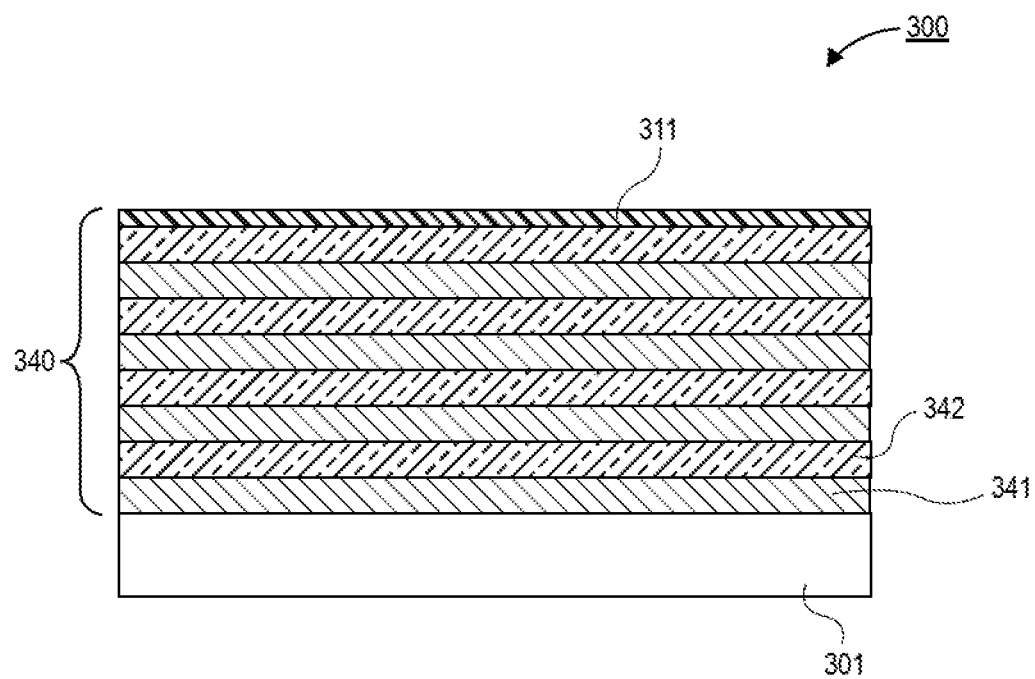
FIGS. 3A-3K are cross-sectional illustrations depicting a process for forming a 2D semiconductor device with charge transfer spacers, in accordance with an embodiment.

Referring now to FIG. 3A, a cross-sectional illustration of the semiconductor device 300 at a stage of manufacture is shown, in accordance with an embodiment. In an embodiment, a stack 340 is disposed over a substrate 301. The stack 340 may comprise alternating first layers 341 and second layers 342. The first layers 341 and the second layers 342 may be materials that are etch selective with respect to each other. In a particular embodiment, the first layer 341 may comprise aluminum nitride and the second layer 342 may comprise gallium nitride. In an alternative embodiment, the first layer 341 may comprise an oxide and the second layer 342 may comprise a nitride. In an embodiment, a protective barrier layer 311 may be disposed over a top surface of the stack 340.

Figure 3B:
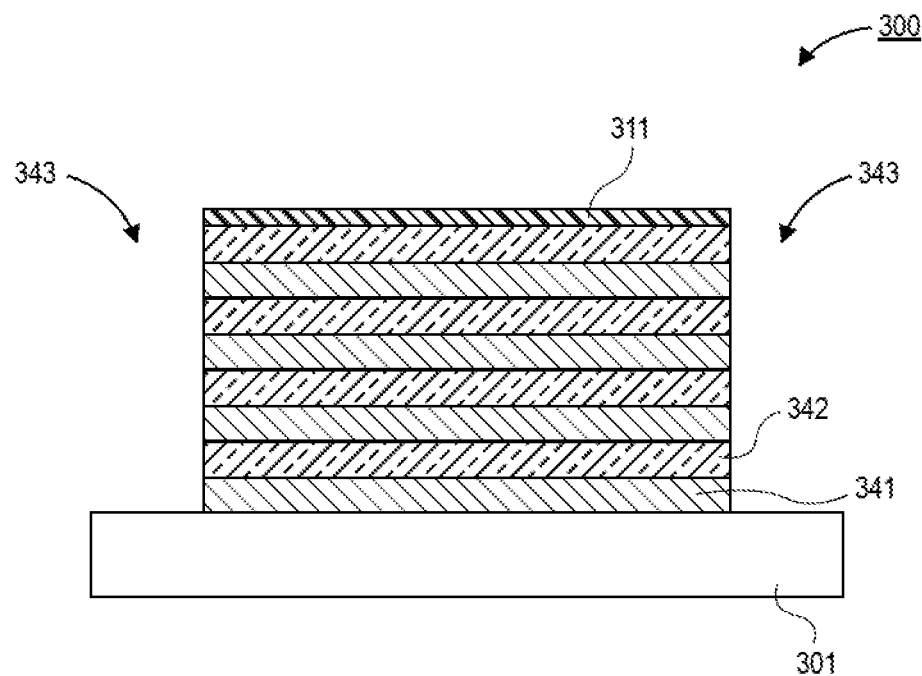

Referring now to FIG. 3B, a cross-sectional illustration of the semiconductor device 300 after recesses 343 are formed at the ends of the stack 340 is shown, in accordance with an embodiment. In an embodiment, the stack 340 may be etched with a dry etching process to form the recesses 343. The recesses 343 may expose a surface of the substrate 301. The etching process may be a dry etching process that etches both the first layers 341 and the second layers 342.

Figure 3C:
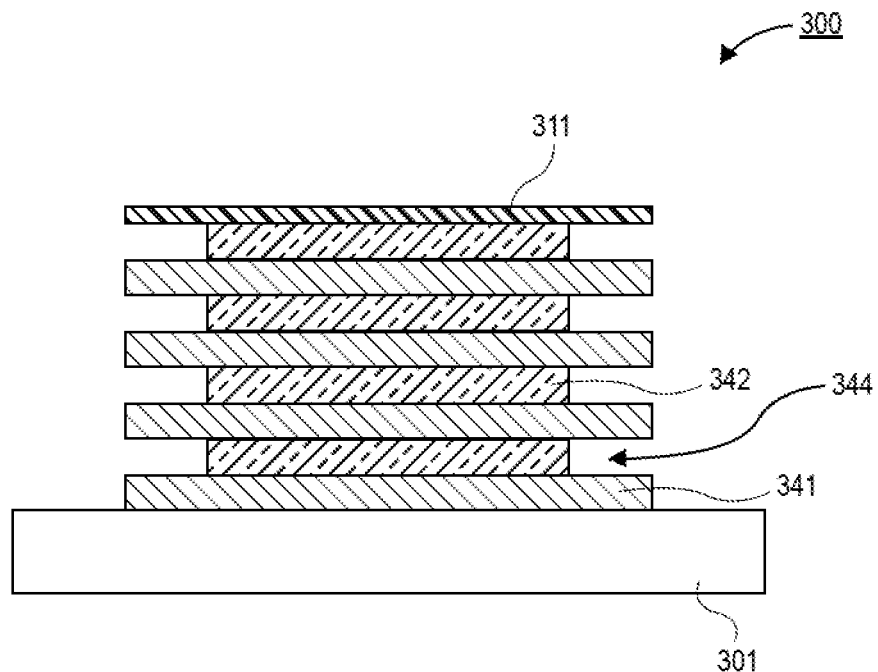

Referring now to FIG. 3C, a cross-sectional illustration of the semiconductor device 300 after lateral recesses 344 are formed in the second layers 342 is shown, in accordance with an embodiment. In an embodiment, the lateral recesses 344 may be formed with a wet etching chemistry that selectively etches the second layers 342 while leaving the first layers 341 substantially unaltered. In an embodiment, the etch is a timed etch in order to provide recesses of a desired dimension.

Figure 3D:
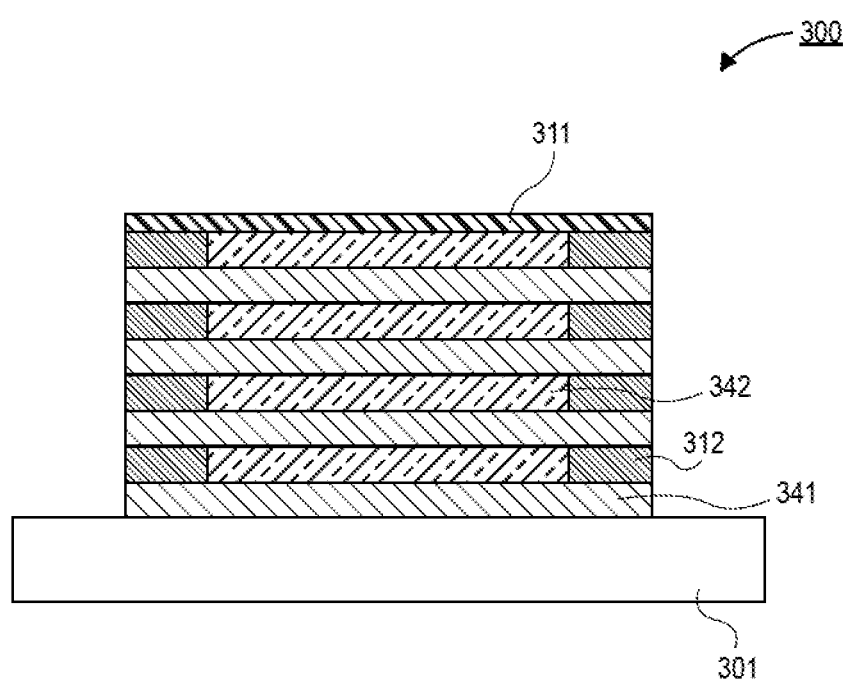

Referring now to FIG. 3D, a cross-sectional illustration of the semiconductor device 300 after the lateral recesses 344 are filled with a spacer 312 is shown, in accordance with an embodiment. In an embodiment, the spacer 312 is a material that will provide charge transferring to the subsequently formed 2D semiconductor sheets. For example, the spacer 312 may comprise aluminum oxide or molybdenum oxide. In an embodiment, the spacer 312 may be deposited with an atomic layer deposition (ALD) process.

Figure 3E:
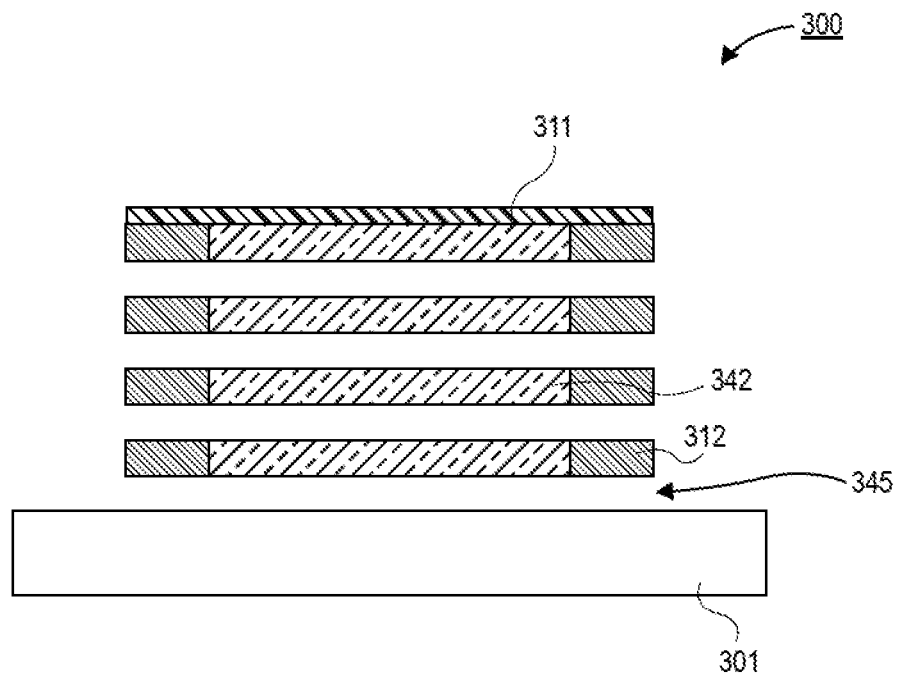

Referring now to FIG. 3E, a cross-sectional illustration of the semiconductor device 300 after the first layers 341 are removed is shown, in accordance with an embodiment. In an embodiment, removal of the first layers 341 provides openings 345 between the second layers 342. The first layers 341 may be removed with a wet etching chemistry that is selective to the first layer 341 over the second layers 342 and the spacers 312.

Figure 3F:
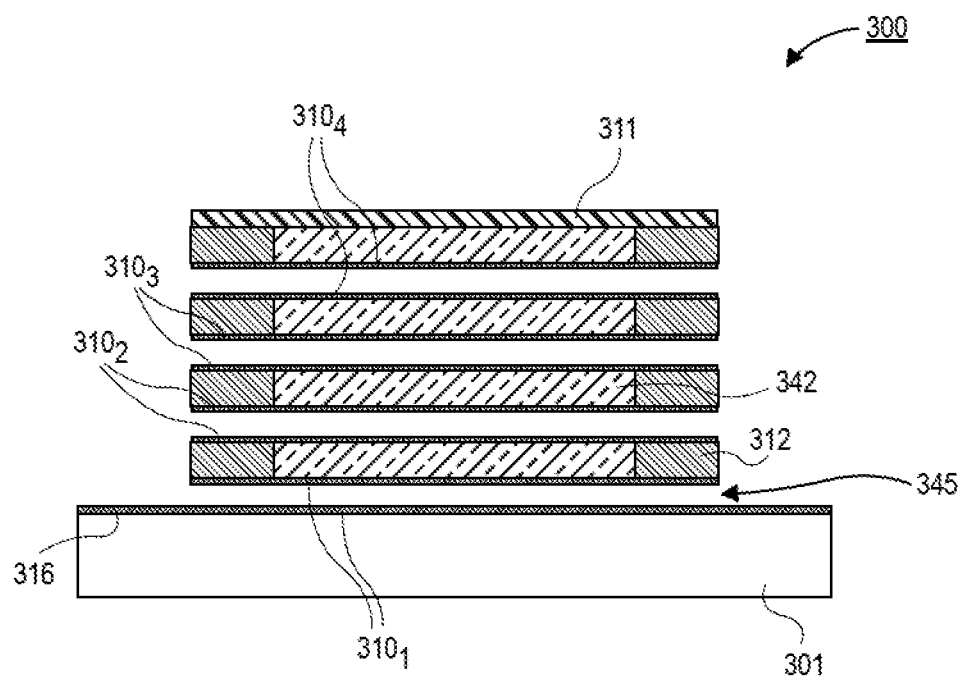

Referring now to FIG. 3F, a cross-sectional illustration of the semiconductor device 300 after 2D semiconductor sheets 310 are formed in the openings 345 is shown, in accordance with an embodiment. In the illustrated embodiment, four pairs of 2D semiconductor sheets $310_1$-$310_4$ are provided. However, more or fewer 2D semiconductor sheets 310 may be provided by increasing or decreasing the number of first layers 341 and second layers 342. As shown in the cross-section view, each pair of 2D semiconductor sheets 310 comprise a top sheet and a bottom sheet. It is to be appreciated that the top sheet and the bottom sheet may be coupled together out of the plane of FIG. 3F to provide a tube-like structure. In some embodiments, the tube-like structure may comprise an opening (e.g. along the length of the tube or a portion of the length of the tube) in order to provide an access point to contact an interior gate electrode within the 2D semiconductor sheet 310 that will be deposited in a subsequent processing operation.

In an embodiment, the 2D semiconductor sheets 310 comprise a monolayer of the 2D semiconductor material. In other embodiments, the 2D semiconductor sheets 310 comprise several layers of the 2D semiconductor material. In an embodiment, the 2D semiconductor comprises TMDs, such as, but not limited to $MoS_2$, $WS_2$, $MoSe_2$, or $WSe_2$. The 2D semiconductor may also comprise InSe. In an embodiment, the 2D material is disposed on exposed surfaces by a metal organic chemical vapor deposition (MOCVD) process, with an ALD and chalcogenization process, or any other suitable process. Since the deposition process is conformal, a portion 316 of the bottommost 2D semiconductor sheet $310_1$ may extend out past the edge of the spacers 312. Additionally, due to the conformal deposition process, portions of the 2D material may deposit along sidewalls between pairs of sheets 310. For example, the top sheet $310_1$ may be coupled to the bottom sheet $310_1$ out of the plane of FIG. 3F. In such embodiments, the semiconductor sheets 310 may be part of a tube-like structure.

Figure 3G:
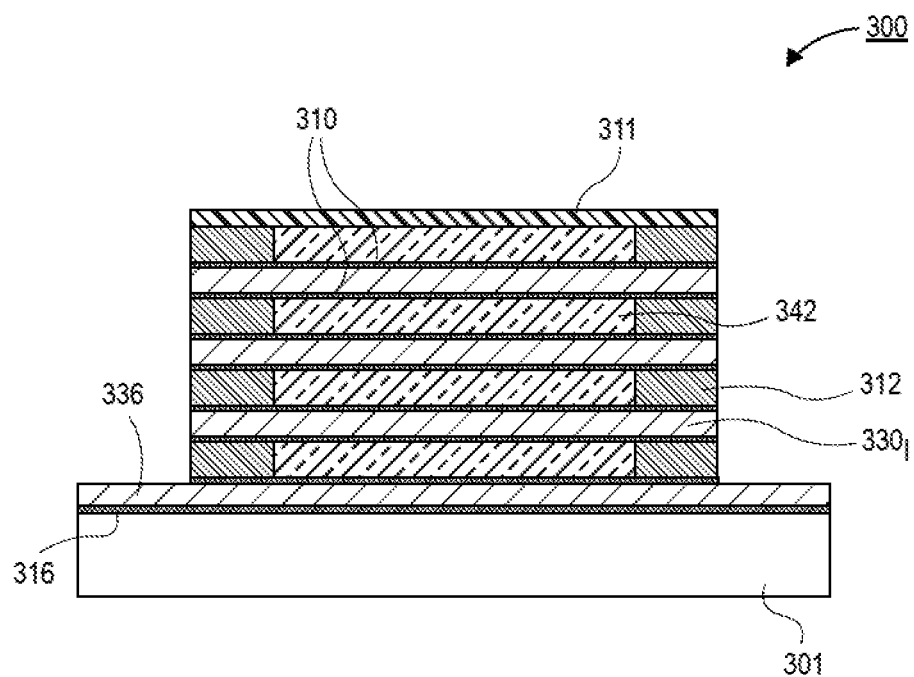

Referring now to FIG. 3G, a cross-sectional illustration of the semiconductor device 300 after an interior gate electrode $330_I$ is disposed over interior surfaces of the 2D semiconductor sheets 310 (i.e., between pairs of 2D semiconductor sheets 310) is shown, in accordance with an embodiment. In the illustrated embodiment, the interior gate electrode $330_I$ may comprise a high-k dielectric material (not shown) in direct contact with the 2D semiconductor sheet 310 and a conductive electrode over the high-k dielectric material. That is, a high-k dielectric material may separate the conductive material of the interior gate electrode $330_I$ from the interior surface of the 2D semiconductor sheet 310. The high-k dielectric material and the conductive material may be deposited with ALD processes or the like. In a conformal deposition process, portion 336 of the interior gate electrode $330_I$ may extend out past the outer edge of the spacers 312 over the portion 316 of the bottommost 2D semiconductor sheet 310. In an embodiment, the portions 336 and 316 may be etched away, or the portions 336 and 316 may persist into the final device as a remnant of manufacturing.

Figure 3H:
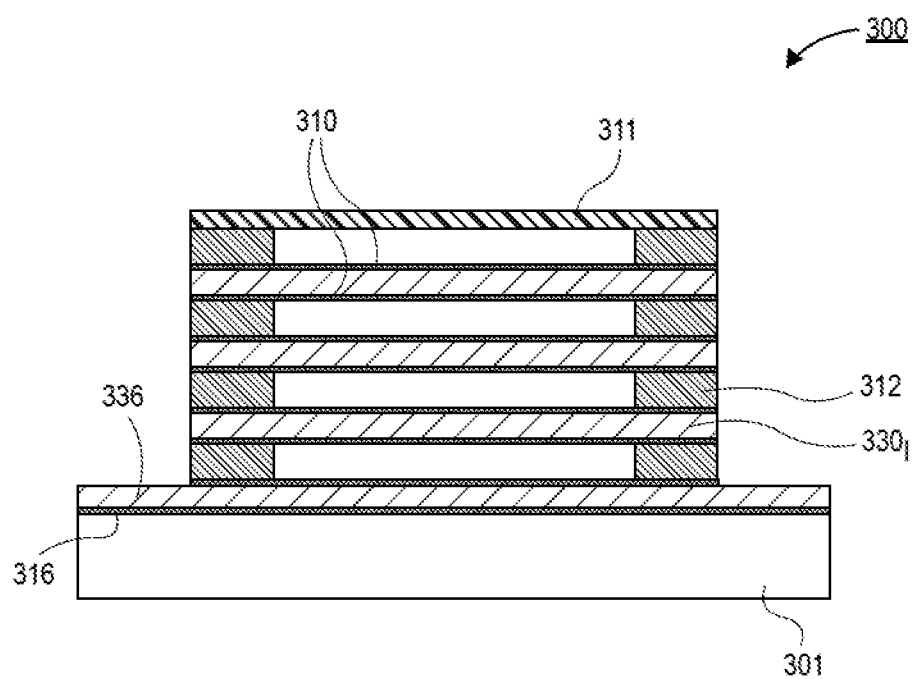

Referring now to FIG. 3H, a cross-sectional illustration of the semiconductor device 300 after the second layers 342 are removed is shown, in accordance with an embodiment. Removal of the remaining portions of the second layers 342 allows for dual gate control of the 2D semiconductor sheets 310, as will be described below. However, in embodiments that do not require dual gate control, the second layers 342 may be left in place to form a structure similar to the semiconductor device 100 in FIG. 1C. In an embodiment, the second layers 342 may be removed with a wet etching process.

Figure 3I:
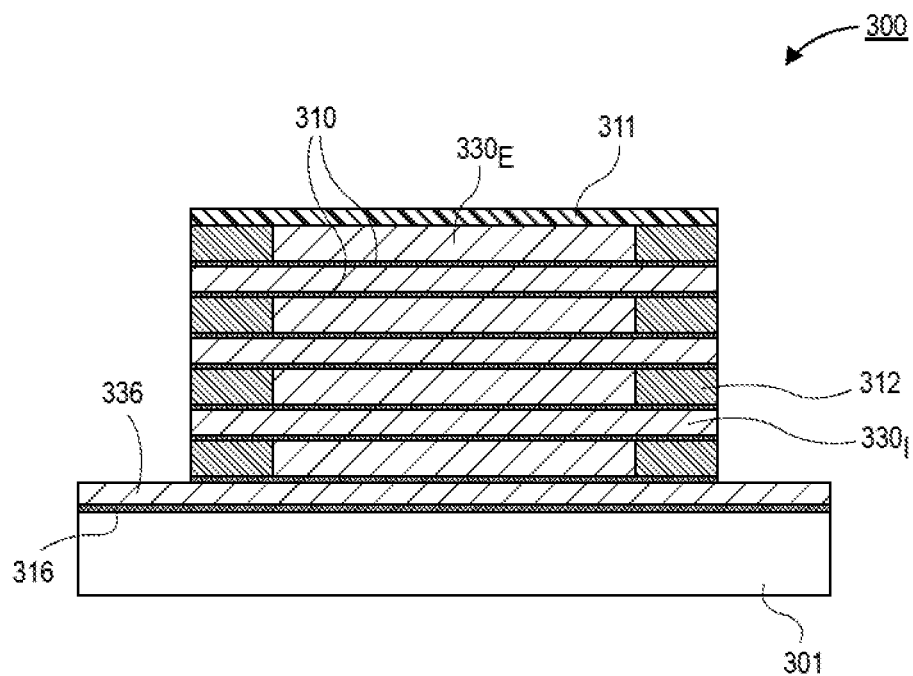

Referring now to FIG. 3I, a cross-sectional illustration of the semiconductor device 300 after an exterior gate electrode $330_E$ is formed around the 2D semiconductor sheets 310 is shown, in accordance with an embodiment. The exterior gate electrode $330_E$ fills the space vacated by the second layers 342. In an embodiment, the exterior gate electrode $330_E$ may be substantially the same materials as the interior gate electrode $330_I$. For example, the exterior gate electrode $330_E$ may comprise a high-k dielectric in direct contact with the 2D semiconductor sheets 310 and a conductive material over the high-k dielectric.

Figure 3J:
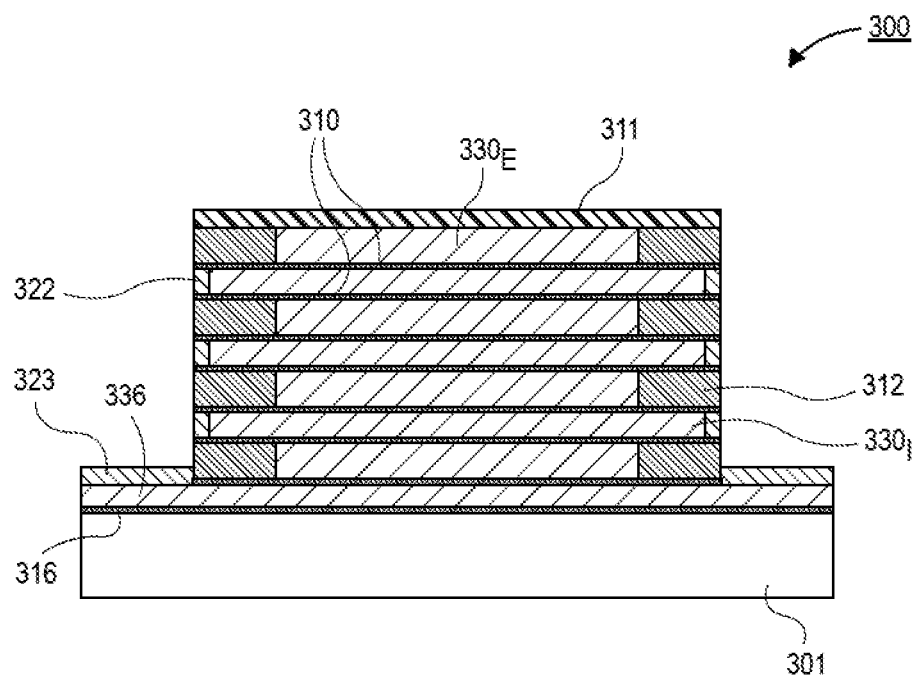

Referring now to FIG. 3J, a cross-sectional illustration of the semiconductor device 300 after the interior gate electrode $330_I$ is laterally recessed and insulating plugs 322 are provided in the recesses is shown, in accordance with an embodiment. The insulating plugs 322 will electrically isolate subsequently deposited S/D contacts from the interior gate electrode $330_I$. In embodiments with remnant portions 336 and 316, an insulating barrier 323 may be deposited over the remnant portion 336 to provide electrical isolation from the S/D contacts.

Figure 3K:
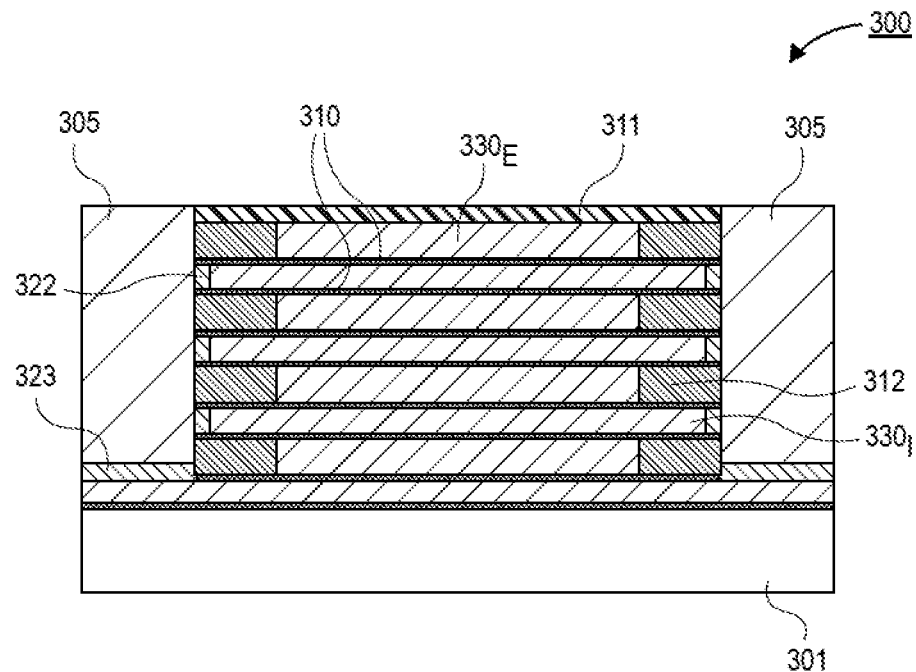

Referring now to FIG. 3K, a cross-sectional illustration of the semiconductor device 300 after S/D contacts 305 are formed adjacent to the 2D semiconductor sheets 310 is shown, in accordance with an embodiment. In an embodiment, the S/D contacts 305 are a highly doped semiconductor material or a conductive material. In an embodiment, the interior and exterior gate electrodes $330_I$ and $330_E$ may be contacted by a contact metal that is provided out of the plane of FIG. 3K, between the S/D contacts 305.

Figure 4A:
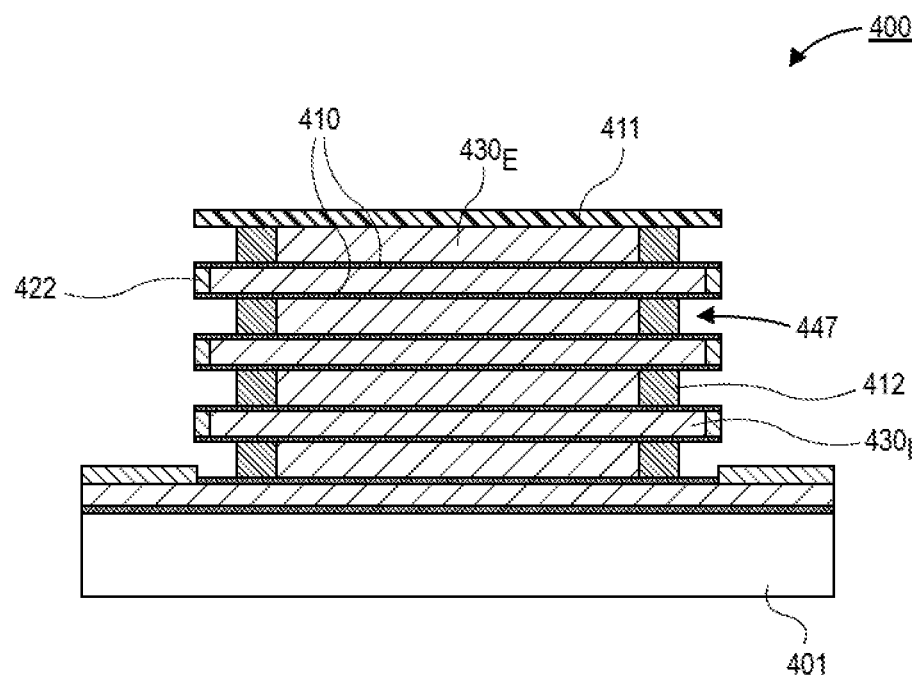
FIGS. 4A and 4B are cross-sectional illustrations depicting a process for forming a 2D semiconductor device with recessed charge transfer spacers, in accordance with an embodiment.
Figure 4B:
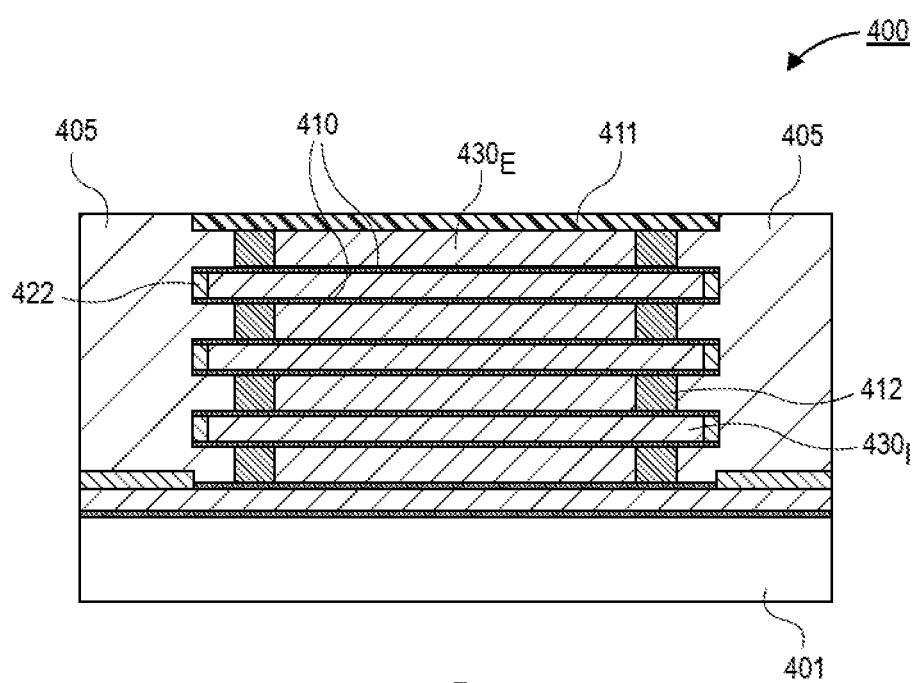

Referring now to FIGS. 4A and 4B, cross-sectional illustrations of an alternative contact scheme is provided, in accordance with an embodiment. In an embodiment, the resulting semiconductor device 400 in FIG. 4B may be substantially similar to the semiconductor device 100 in FIG. 1B.

Referring now to FIG. 4A, a cross-sectional illustration of a semiconductor device 400 in a stage of manufacture is shown, in accordance with an embodiment. The processing up to FIG. 4A may be substantially similar to the processing described above with respect to FIGS. 3A-3J, and will not be repeated here. The semiconductor device 400 comprises a substrate with a stack of 2D semiconductor sheets 410 over the substrate 401. A barrier layer 411 covers the stack of 2D semiconductor sheets 410. An interior gate electrode $430_I$ is within the 2D semiconductor sheets 410 and an exterior gate electrode $430_E$ surrounds an exterior of the 2D semiconductor sheets 410. Plugs 422 cover the ends of the 2D semiconductor sheets 410.

In an embodiment, the spacers 412 around the ends of the 2D semiconductor sheets 410 have been laterally recessed to form recesses 447. The spacers 412 may be recessed with a wet etching process. Recessing the spacers 412 provides an increased interface area between the 2D semiconductor sheets 410 and the subsequently deposited S/D contacts.

Referring now to FIG. 4B, a cross-sectional illustration of the semiconductor device 400 after the formation of the S/D contacts 405 is shown, in accordance with an embodiment. As shown, the recesses 447 are filled by the S/D contacts 405 so that the S/D contacts wrap around ends of the 2D semiconductor sheets 410.

Figure 5:
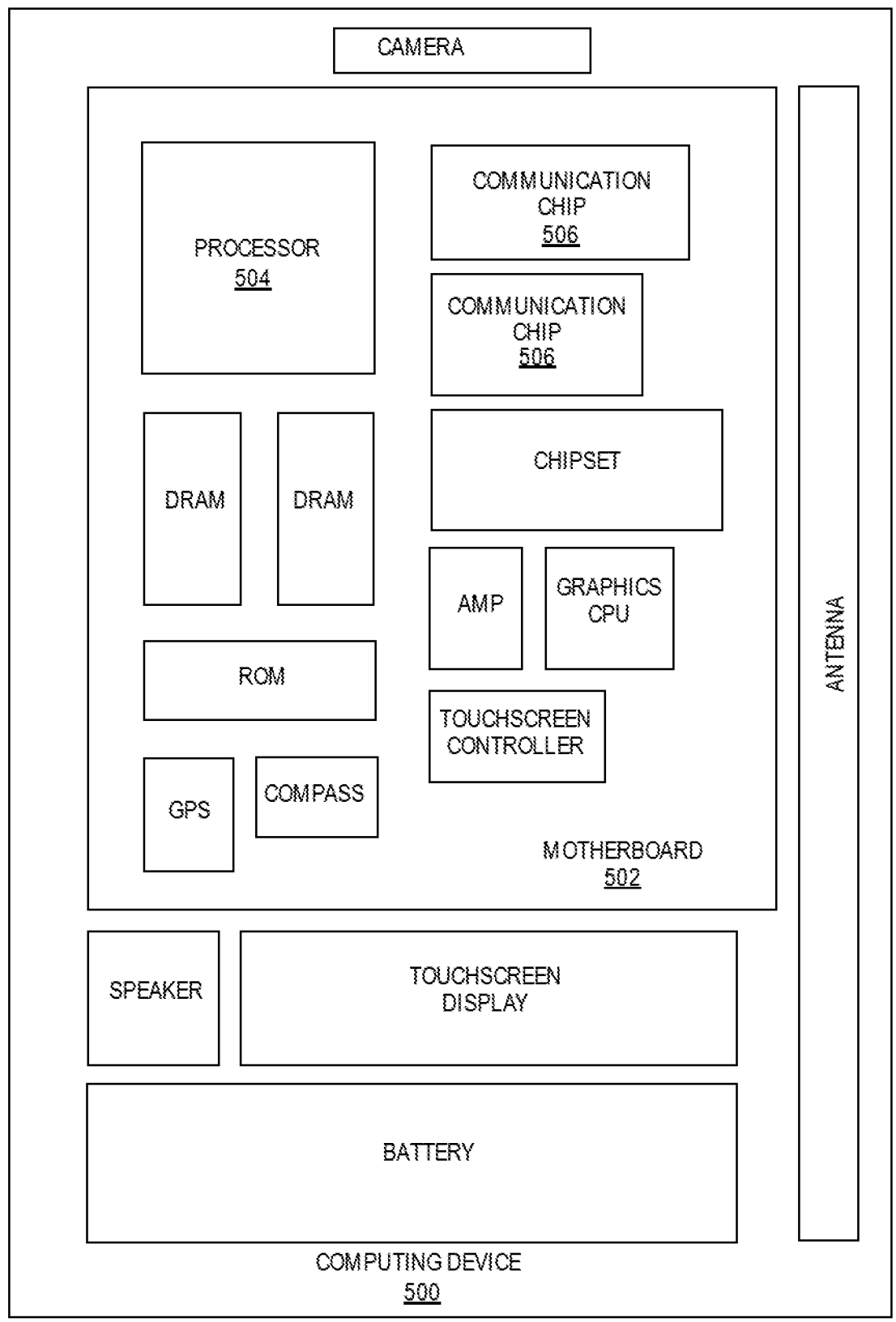
FIG. 5 illustrates a computing device in accordance with one implementation of an embodiment of the disclosure.

FIG. 5 illustrates a computing device 500 in accordance with one implementation of an embodiment of the disclosure. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In an embodiment, the integrated circuit die of the processor may comprise a transistor device with 2D semiconductor sheets with spacers used for charge transferring in order to reduce contact resistance, such as those described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In an embodiment, the integrated circuit die of the communication chip may comprise a transistor device with 2D semiconductor sheets with spacers used for charge transferring in order to reduce contact resistance, such as those described herein.

In further implementations, another component housed within the computing device 500 may comprise a transistor device with 2D semiconductor sheets with spacers used for charge transferring in order to reduce contact resistance, such as those described herein.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
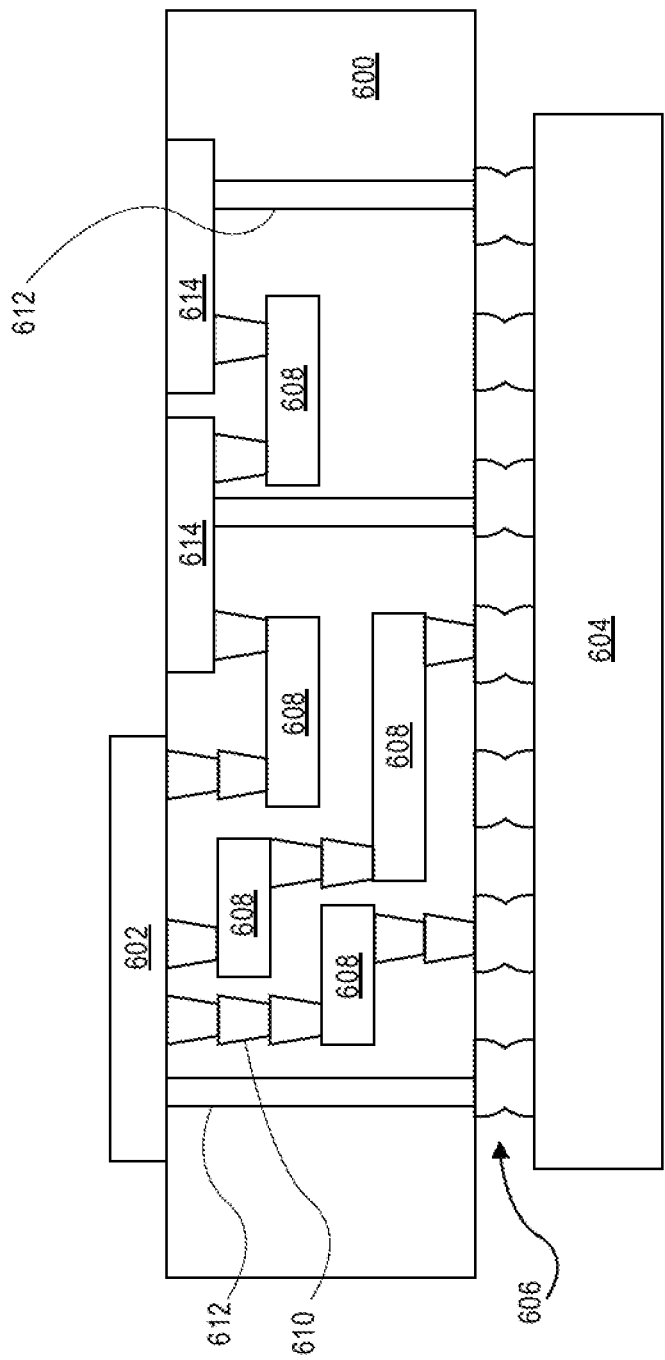
FIG. 6 is an interposer implementing one or more embodiments of the disclosure.

FIG. 6 illustrates an interposer 600 that includes one or more embodiments of the disclosure. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. In an embodiment, one of both of the first substrate 602 and the second substrate 604 may comprise a transistor device with 2D semiconductor sheets with spacers used for charge transferring in order to reduce contact resistance, in accordance with embodiments described herein. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer 600 may be formed of alternate rigid or flexible materials that may include the same materials described above for use in a semiconductor substrate, such as silicon, germanium, and other group III-V and group IV materials The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the disclosure, apparatuses or processes disclosed herein may be used in the fabrication of interposer 600.

Thus, embodiments of the present disclosure may comprise a transistor device with 2D semiconductor sheets with spacers used for charge transferring in order to reduce contact resistance, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a semiconductor device, comprising: a stack of two-dimensional (2D) semiconductor sheets, wherein individual ones of the 2D semiconductor sheets have a first end and a second end opposite from the first end; a first spacer over the first end of the 2D semiconductor sheets; a second spacer over the second end of the 2D semiconductor sheets; a gate electrode between the first spacer and the second spacer; a source contact adjacent to the first end of the 2D semiconductor sheets; and a drain contact adjacent to the second end of the 2D semiconductor sheets.

Example 2: the semiconductor device of Example 1, wherein the 2D semiconductor sheets comprise transition metal dichalcogenides.

Example 3: the semiconductor device of Example 1 or Example 2, wherein the gate electrode is between pairs of the 2D semiconductor sheets.

Example 4: the semiconductor device of Example 3, wherein the gate electrode is separated from the source contact and the drain contact by an insulating plug between the 2D semiconductor sheets.

Example 5: the semiconductor device of Example 3, wherein a second gate electrode is around an exterior of pairs of 2D semiconductor sheets.

Example 6: the semiconductor device of Examples 1-5, wherein the first end of the 2D semiconductor sheet is substantially coplanar with a surface of the first spacer, and wherein the second end of the 2D semiconductor sheet is substantially coplanar with a surface of the second spacer.

Example 7: the semiconductor device of Examples 1-6, wherein a surface of the first spacer is recessed from the first end of the 2D semiconductor sheet, and wherein a surface of the second spacer is recessed from the second end of the 2D semiconductor sheet.

Example 8: the semiconductor device of Examples 1-7, wherein a bottommost 2D semiconductor sheet comprises protrusions that extend below the source contact and the drain contact.

Example 9: the semiconductor device of Example 8, wherein an insulating layer is disposed over the protrusions.

Example 10: the semiconductor device of Examples 1-9, wherein the first spacer and the second spacer are charge-transfer materials.

Example 11: the semiconductor device of Example 10, wherein the first spacer and the second spacer comprise aluminum and oxygen, or molybdenum and oxygen.

Example 12: a method of forming a semiconductor device, comprising: forming a stack of first layers and second layers in an alternating pattern over a substrate; forming a recesses into a first end and a second end of the stack to expose the substrate; laterally recessing the second layers at the first end and the second to form lateral recesses; filling the lateral recesses to form a first spacer at the first end and a second spacer at the second end; removing the first layers; forming two-dimensional (2D) semiconductor sheets between the second layers, the first spacer, and the second spacer; filling a space between pairs of the 2D semiconductor sheets with a gate electrode; forming a source contact adjacent to a first end of the 2D semiconductor sheets; and forming a drain contact adjacent to a second end of the 2D semiconductor sheets.

Example 13: the method of Example 12, further comprising: removing the second layers after filling of the space between pairs of the 2D semiconductor sheets with the gate electrode; and disposing a second gate electrode around an exterior of the 2D semiconductor sheets between the first spacer and the second spacer.

Example 14: the method of Example 12 or Example 13, further comprising: laterally recessing the gate electrode between the 2D semiconductor sheets to form second lateral recesses; and filling the second lateral recesses with an insulating plug.

Example 15: method of Examples 12-14, wherein the 2D semiconductor sheets comprise transition metal dichalcogenides.

Example 16: the method of Examples 12-15, wherein the first spacer and the second spacer are charge-transfer materials.

Example 17: the method of Example 16, wherein the first spacer and the second spacer comprise aluminum and oxygen, or molybdenum and oxygen.

Example 18: the method of Examples 12-17, wherein the first layers comprise aluminum and nitrogen, and wherein the second layers comprise gallium and nitrogen, or wherein the first layers comprise an oxide, and wherein the second layers comprise a nitride.

Example 19: an electronic system, comprising: a board; an electronic package coupled to the board; and a die electrically coupled to the electronic package, wherein the die comprises: a stack of two-dimensional (2D) semiconductor sheets, wherein individual ones of the 2D semiconductor sheets have a first end and a second end opposite from the first end; a first spacer over the first end of the 2D semiconductor sheets; a second spacer over the second end of the 2D semiconductor sheets; a gate electrode between the first spacer and the second spacer; a source contact adjacent to the first end of the 2D semiconductor sheets; and a drain contact adjacent to the second end of the 2D semiconductor sheets.

Example 20: the electronic system of Example 19, wherein the 2D semiconductor sheets comprise transition metal dichalcogenides.

What is claimed is:

1. A semiconductor device, comprising:
    a stack of two-dimensional (2D) semiconductor sheets, wherein individual ones of the 2D semiconductor sheets have a first end and a second end opposite from the first end;
    a first spacer over the first end of the 2D semiconductor sheets;
    a second spacer over the second end of the 2D semiconductor sheets;
    a gate electrode between the first spacer and the second spacer, wherein the gate electrode is between pairs of the 2D semiconductor sheets;
    a source contact adjacent to the first end of the 2D semiconductor sheets; and
    a drain contact adjacent to the second end of the 2D semiconductor sheets.

2. The semiconductor device of claim 1, wherein the 2D semiconductor sheets comprise transition metal dichalcogenides.

3. The semiconductor device of claim 1, wherein the gate electrode is separated from the source contact and the drain contact by an insulating plug between the 2D semiconductor sheets.

4. The semiconductor device of claim 1, wherein a second gate electrode is around an exterior of pairs of 2D semiconductor sheets.

5. The semiconductor device of claim 1, wherein the first end of the 2D semiconductor sheet is substantially coplanar with a surface of the first spacer, and wherein the second end of the 2D semiconductor sheet is substantially coplanar with a surface of the second spacer.

6. The semiconductor device of claim 1, wherein a surface of the first spacer is recessed from the first end of the 2D semiconductor sheet, and wherein a surface of the second spacer is recessed from the second end of the 2D semiconductor sheet.

7. The semiconductor device of claim 1, wherein a bottommost 2D semiconductor sheet comprises protrusions that extend below the source contact and the drain contact.

8. The semiconductor device of claim 7, wherein an insulating layer is disposed over the protrusions.

9. The semiconductor device of claim 1, wherein the first spacer and the second spacer are charge-transfer materials.

10. The semiconductor device of claim 9, wherein the first spacer and the second spacer comprise aluminum and oxygen, or molybdenum and oxygen.

11. A method of forming a semiconductor device, comprising:
    forming a stack of first layers and second layers in an alternating pattern over a substrate;
    forming a recesses into a first end and a second end of the stack to expose the substrate;
    laterally recessing the second layers at the first end and the second to form lateral recesses;
    filling the lateral recesses to form a first spacer at the first end and a second spacer at the second end;
    removing the first layers;
    forming two-dimensional (2D) semiconductor sheets between the second layers, the first spacer, and the second spacer;
    filling a space between pairs of the 2D semiconductor sheets with a gate electrode;
    forming a source contact adjacent to a first end of the 2D semiconductor sheets; and
    forming a drain contact adjacent to a second end of the 2D semiconductor sheets.

12. The method of claim 11, further comprising:
    removing the second layers after filling of the space between pairs of the 2D semiconductor sheets with the gate electrode; and
    disposing a second gate electrode around an exterior of the 2D semiconductor sheets between the first spacer and the second spacer.

13. The method of claim 11, further comprising:
    laterally recessing the gate electrode between the 2D semiconductor sheets to form second lateral recesses; and
    filling the second lateral recesses with an insulating plug.

14. The method of claim 11, wherein the 2D semiconductor sheets comprise transition metal dichalcogenides.

15. The method of claim 11, wherein the first spacer and the second spacer are charge-transfer materials.

16. The method of claim 15, wherein the first spacer and the second spacer comprise aluminum and oxygen, or molybdenum and oxygen.

17. The method of claim 11, wherein the first layers comprise aluminum and nitrogen, and wherein the second layers comprise gallium and nitrogen, or wherein the first layers comprise an oxide, and wherein the second layers comprise a nitride.

18. An electronic system, comprising:
    a board;
    an electronic package coupled to the board; and
    a die electrically coupled to the electronic package, wherein the die comprises:
        a stack of two-dimensional (2D) semiconductor sheets, wherein individual ones of the 2D semiconductor sheets have a first end and a second end opposite from the first end;
        a first spacer over the first end of the 2D semiconductor sheets;
        a second spacer over the second end of the 2D semiconductor sheets;
        a gate electrode between the first spacer and the second spacer, wherein the gate electrode is between pairs of the 2D semiconductor sheets;
        a source contact adjacent to the first end of the 2D semiconductor sheets; and
        a drain contact adjacent to the second end of the 2D semiconductor sheets.

19. The electronic system of claim 18, wherein the 2D semiconductor sheets comprise transition metal dichalcogenides.

20. A semiconductor device, comprising:
    a stack of two-dimensional (2D) semiconductor sheets, wherein individual ones of the 2D semiconductor sheets have a first end and a second end opposite from the first end;
    a first spacer over the first end of the 2D semiconductor sheets;
    a second spacer over the second end of the 2D semiconductor sheets, wherein the first end of the 2D semiconductor sheet is substantially coplanar with a surface of the first spacer, and wherein the second end of the 2D semiconductor sheet is substantially coplanar with a surface of the second spacer;
a gate electrode between the first spacer and the second spacer;
a source contact adjacent to the first end of the 2D semiconductor sheets; and
a drain contact adjacent to the second end of the 2D semiconductor sheets.

21. A semiconductor device, comprising:
a stack of two-dimensional (2D) semiconductor sheets, wherein individual ones of the 2D semiconductor sheets have a first end and a second end opposite from the first end;
a first spacer over the first end of the 2D semiconductor sheets;
a second spacer over the second end of the 2D semiconductor sheets, wherein a surface of the first spacer is recessed from the first end of the 2D semiconductor sheet, and wherein a surface of the second spacer is recessed from the second end of the 2D semiconductor sheet;
a gate electrode between the first spacer and the second spacer;
a source contact adjacent to the first end of the 2D semiconductor sheets; and
a drain contact adjacent to the second end of the 2D semiconductor sheets.

22. A semiconductor device, comprising:
a stack of two-dimensional (2D) semiconductor sheets, wherein individual ones of the 2D semiconductor sheets have a first end and a second end opposite from the first end, wherein a bottommost 2D semiconductor sheet comprises protrusions that extend below the source contact and the drain contact, and, wherein an insulating layer is disposed over the protrusions;
a first spacer over the first end of the 2D semiconductor sheets;
a second spacer over the second end of the 2D semiconductor sheets;
a gate electrode between the first spacer and the second spacer;
a source contact adjacent to the first end of the 2D semiconductor sheets; and
a drain contact adjacent to the second end of the 2D semiconductor sheets.

23. A semiconductor device, comprising:
a stack of two-dimensional (2D) semiconductor sheets, wherein individual ones of the 2D semiconductor sheets have a first end and a second end opposite from the first end;
a first spacer over the first end of the 2D semiconductor sheets;
a second spacer over the second end of the 2D semiconductor sheets, wherein the first spacer and the second spacer are charge-transfer materials;
a gate electrode between the first spacer and the second spacer;
a source contact adjacent to the first end of the 2D semiconductor sheets; and
a drain contact adjacent to the second end of the 2D semiconductor sheets.

24. The semiconductor device of claim 23, wherein the first spacer and the second spacer comprise aluminum and oxygen, or molybdenum and oxygen.

* * * * *